(12) United States Patent
Jeong

(10) Patent No.: US 7,365,984 B2
(45) Date of Patent: Apr. 29, 2008

(54) DISPLAY MODULE

(75) Inventor: Kwang-Jin Jeong, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/442,382

(22) Filed: May 30, 2006

(65) Prior Publication Data

US 2006/0268525 A1    Nov. 30, 2006

(30) Foreign Application Priority Data

May 31, 2005    (KR)    .................... 10-2005-0046126

(51) Int. Cl.
  *H05K 7/20* (2006.01)
  *F28D 15/00* (2006.01)
(52) U.S. Cl. .............. 361/709; 361/704; 361/710; 361/719; 165/104.33; 165/185; 174/16.3
(58) Field of Classification Search ........... 361/704, 361/707, 709, 715, 719, 710; 165/80.3, 104.33, 165/185; 313/46; 348/748; 349/161; 345/60
See application file for complete search history.

(56) References Cited

U.S. PATENT DOCUMENTS

| | | | | |
|---|---|---|---|---|
| 4,689,720 A | * | 8/1987 | Daszkowski | 361/704 |
| 5,552,960 A | * | 9/1996 | Nelson et al. | 361/687 |
| 5,896,269 A | * | 4/1999 | Autry | 361/704 |
| 6,678,159 B1 | * | 1/2004 | Barcley | 361/704 |
| 6,771,504 B2 | * | 8/2004 | Barcley | 361/704 |
| 7,164,586 B2 | * | 1/2007 | Lin | 361/714 |
| 2004/0178876 A1 | * | 9/2004 | Koizumi et al. | 336/200 |
| 2006/0060328 A1 | * | 3/2006 | Ewes et al. | 165/80.2 |
| 2006/0158853 A1 | * | 7/2006 | Jeong | 361/704 |
| 2007/0146990 A1 | * | 6/2007 | Hsieh | 361/690 |

FOREIGN PATENT DOCUMENTS

| JP | 2000082886 A | * | 3/2000 |
|---|---|---|---|
| KR | 2006069737 A | * | 6/2006 |

* cited by examiner

*Primary Examiner*—Jayprakash Gandhi
*Assistant Examiner*—Robert J Hoffberg
(74) *Attorney, Agent, or Firm*—Lee & Morse, P.C.

(57) ABSTRACT

A display module having an improved heatsink effect may include a display panel reproducing an image, a chassis supporting the display panel, a driving circuit board disposed on a surface of the chassis opposite to the display panel to generate an electrical signal for driving the display panel, the driving circuit board including at least one heat emissive circuit element, a first heatsink disposed on the heat emissive circuit element and a second heatsink disposed on the chassis. The first heatsink and the second heatsink may be thermally connected by a foldable connecting member.

16 Claims, 2 Drawing Sheets

DISPLAY MODULE

BACKGROUND OF THE INVENTION

1. Field of the Invention

The present invention relates to a display module. More particularly, the present invention relates to a display module having an improved heatsink effect.

2. Description of the Related Art

A display module is a key component of a display device. A display module may include a display panel, a driving circuit unit for driving the display panel, and a chassis for supporting the driving circuit and the display panel. The display panel may be a plasma display panel (PDP).

The PDP may include a first panel and a second panel. The chassis may have a convex member for reinforcing the rigidity thereof. The driving circuit unit may have signal transmitting units and a circuit for generating electrical signals to drive the PDP.

The driving circuit unit may have circuit elements disposed thereon. A large amount of heat may be generated by a heat emissive circuit element during the operation of the plasma display module. This generated heat may degrade the heat emissive circuit unit and the performance of the driving circuit unit if it is not dissipated away from the heat emissive circuit element. Therefore, the heat emissive circuit element may be mounted with a heatsink or a heatsink plate for dissipating the generated heat outside.

Such heat emissive circuit elements may include monolithic integrated circuit (MIC) elements and intelligent power module (IPM) elements. The MIC element may include a conductive layer of a given pattern and a semiconductor chip mounted on the conductive layer. The IPM element may include a conductive layer of a given pattern, an active element, e.g., a semiconductor chip, and a passive element, e.g., a resistor and a condenser, mounted on the conductive layer. Due to its additional components, the IPM element may have larger heat emission area and may emit a larger amount of heat than the MIC element.

Accordingly, in a conventional display module, a thermal conductive medium may be disposed on an IPM element and a first heatsink plate may be disposed on the thermal conductive medium and connected to a second heatsink plate disposed on a chassis via a screw, so that heat generated by the IPM element may be transmitted to the thermal conductive medium, the first heatsink plate, the screw, the second heatsink plate and the chassis to thereby dissipate the generated heat to the outside.

The second heatsink plate may not be closely connected to the chassis due to process tolerance. Accordingly, the thermal conductive medium disposed between the IPM element and the first heatsink plate must be thick so as to closely connect the second heatsink plate to the chassis. However, the use of the thick thermal conductive medium greatly reduces the heatsink effect on the IPM element because the medium has a very low heat conductivity, e.g., compared with metal.

SUMMARY OF THE INVENTION

The present invention provides a display module, which substantially overcomes one or more of the disadvantages of the related art.

It is therefore a feature of an embodiment of the present invention to provide a display module that has an improved heatsink structure for a heat emissive circuit element which generates much heat (such as an IPM element) so as to effectively dissipate heat generated by the heat emissive circuit element through a chassis.

At least one of the above and other features and advantages may be realized by providing a display module including a display panel for reproducing an image, a chassis supporting the display panel, a driving circuit board disposed on a surface of the chassis opposite to the display panel to generate an electrical signal for driving the display panel, the driving circuit board including at least one heat emissive circuit element, a first heatsink disposed on the heat emissive circuit element, a second heatsink disposed on the chassis, and a foldable connecting member thermally connecting the first heatsink and the second heatsink.

The first and second heatsinks each may include a base portion and at least one heatsink fin. The foldable connecting member may be connected between the heatsink fin located at one end of the first heatsink and the heatsink fin located at one end of the second heatsink. The base portion of the first heatsink may be disposed on the heat emissive circuit element. The base portion of the second heatsink may be disposed on the chassis.

The heat emissive circuit element may include at least two layers including a main element layer and a thermal conductive layer, and the first heatsink may be disposed on the thermal conductive layer.

The display module may further include a thermal conductive medium disposed between the heat emissive circuit element and the first heatsink. The thermal conductive medium may be thermal conductive grease and/or a thermal conductive heatsink sheet.

The heat emissive circuit element may be an IPM element formed by combining two or more different ICs or by including an IC and an independent circuit element.

At least one of the first heatsink, the second heatsink and the foldable connecting member may be formed to include aluminum or copper.

The foldable connecting member may have a plurality of folds. The foldable connecting member may be elastic.

The first heatsink may include a base portion and a plurality of heatsink fins.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
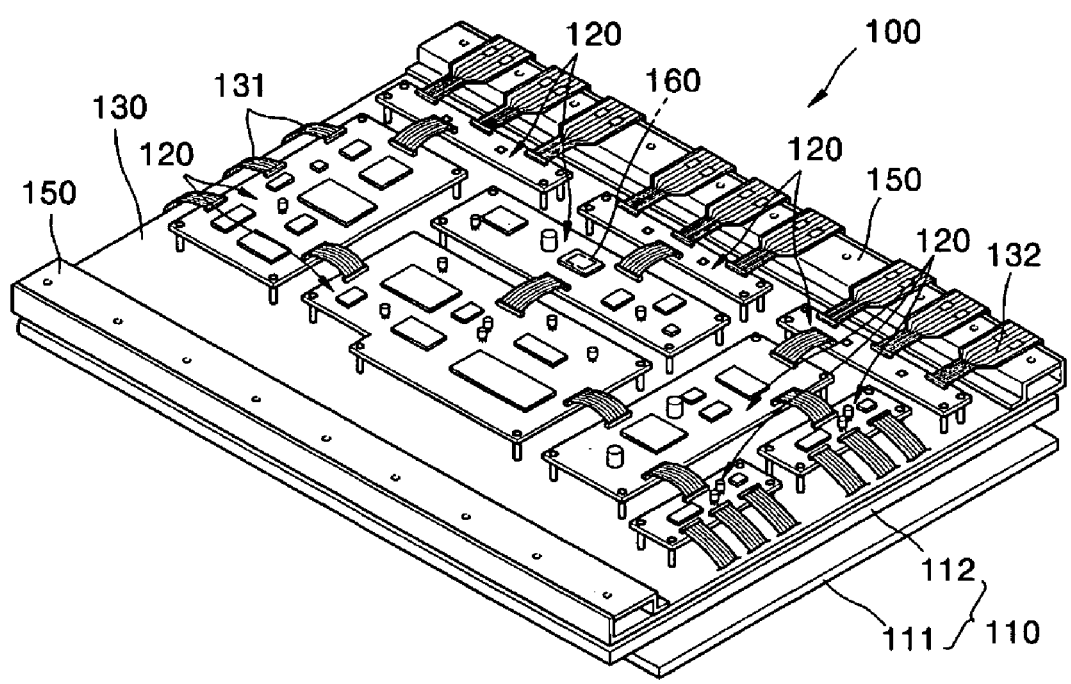
FIG. 1 illustrates a perspective view of a display module according to an embodiment of the present invention.

Korean Patent Application No. 10-2005-0046126, filed on May 31, 2005, in the Korean Intellectual Property Office, and entitled: "Display Module," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
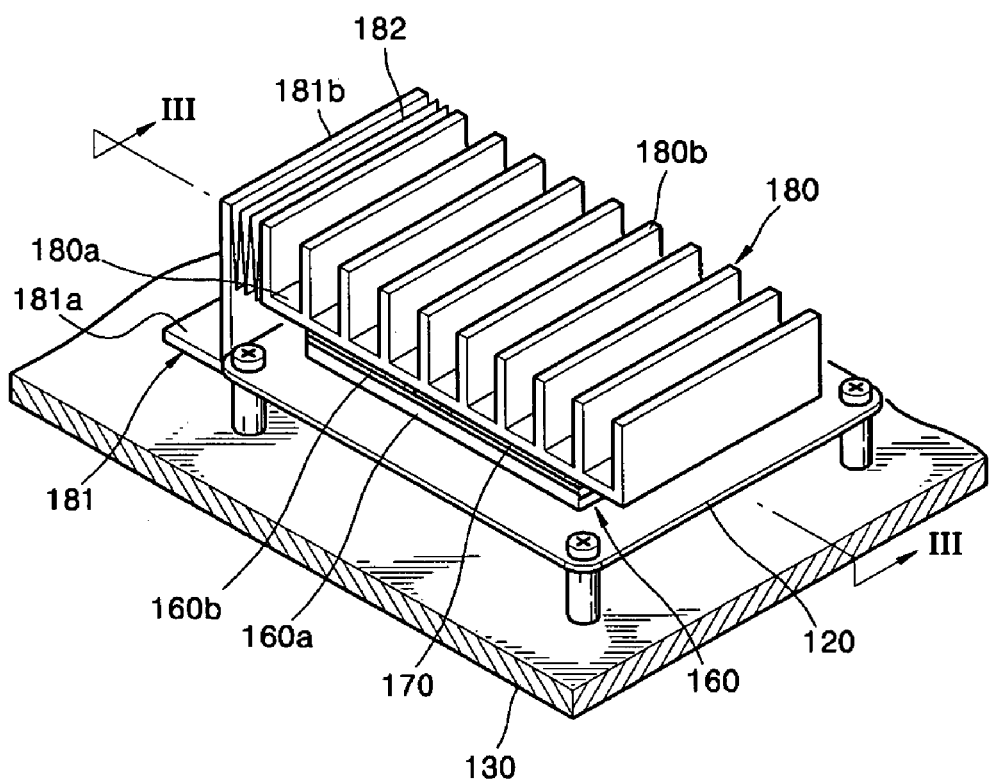
FIG. 2 illustrates an enlarged perspective view of a heatsink and a driving circuit board included in the display module of FIG. 1.
Figure 3:
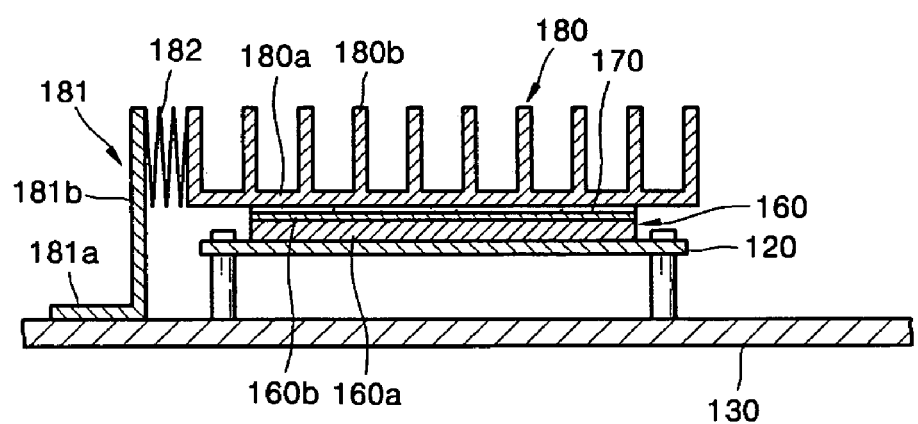
FIG. 3 illustrates a cross-sectional view taken along line III-III in FIG. 2.

FIG. 1 illustrates a perspective view of a display module 100 according to an embodiment of the present invention. FIG. 2 illustrates an enlarged perspective view of a heatsink and a driving circuit board of the display module 100 of FIG. 1. FIG. 3 illustrates a cross-sectional view taken along line III-III in FIG. 2. Referring to FIGS. 1 through 3, the display module 100 may include a display panel, e.g., a PDP 110, for reproducing an image.

The PDP 110 may be any one of various types of PDPs. For example, the PDP 110 may be a 3-electrode AC surface-discharge PDP. In this case, the PDP 110 may include a first panel 111 and a second panel 112 facing each other.

Although not illustrated in FIG. 1, the first panel 111 may include a plurality of sustain electrode pairs disposed on a first substrate, a first dielectric layer covering the sustain electrode pairs and a protective layer coated on the first dielectric layer. The sustain electrode pairs may include strip-shaped common electrodes and scan electrodes.

Although not shown, the second panel 112 may include a plurality of address electrodes disposed on a second substrate to cross the sustain electrode pairs, a second dielectric layer covering the address electrodes, barrier ribs formed on the second dielectric layer to define discharge cells and prevent a cross-talk, and red (R), green (G) and blue (B) phosphor layers coated inside a discharge space defined by the barrier ribs. The discharge cells may be filled with discharge gas, and may correspond to regions where the sustain electrodes and the address electrodes intersect each other.

A chassis 130 may be disposed on a surface of the PDP 110 to support it. The chassis 130 may be sufficiently rigid so as to prevent deformation or damage of the PDP 110.

The display module 100 may include a reinforcement member 150 disposed on a surface of the chassis 130 opposite to the PDP 110 to reinforce the rigidity of the chassis 130. The reinforcement member 150 may be formed in one body with the chassis 130 by, e.g., by deep drawing. Alternatively, the reinforcement member 150 may be formed separately from the chassis 130 and connected to the chassis 130 by a connecting unit, e.g., a bolt.

The chassis 130 may dissipate heat received from the PDP 110, thereby preventing the PDP 110 from having a temperature higher than a predetermined value and preventing the PDP 110 from being thermally deformed or damaged by external impacts. Meanwhile, the PDP 110 and the chassis 130 may be attached together by an adhesive member (not illustrated), e.g., a double-sided tape.

The display module 100 may include a heatsink sheet (not illustrated) disposed between the chassis 130 and the PDP 110. The heatsink sheet may be formed of an aluminum sheet, a copper sheet or a thermal conductive resin. The heatsink sheet may contact a surface of the PDP 110 close to the chassis 130 to prevent accumulation of heat generated during the operation of the PDP 110.

A driving circuit board 120 may be installed on the surface of the chassis 130 opposite to the PDP 110 to drive the PDP 110. The driving circuit board 120 may be mounted with various circuit elements to supply power and apply voltage signals for image reproduction to the PDP 110. The driving circuit board 120 may be electrically connected to the PDP 110 by signal transmitting units 131 and 132. The signal transmitting units 131 and 132 may include, .e.g., a flexible printed cable (FPC), a tape carrier package (TCP) and/or a chip on film (COF).

Heat emissive circuit elements 160 installed on the driving circuit board 120 may be intelligent power module (IPM) elements. Each of the IPM elements may be constructed in various ways, e.g., by combining two or more different integrated circuits (ICs), or by including an IC and an independent circuit element.

The heat emissive circuit element 160 may be mounted with a plurality of elements (not illustrated), so as to generate a large amount of heat during the operation of the display module 100. A first heatsink 180 may be disposed on the surface of the heat emissive circuit element 160 opposite to the driving circuit unit 120 to receive and dissipate the generated heat by heat exchange with ambient air.

The heat emissive circuit element 160 may include at least two layers, e.g., a main element layer 160a and a thermal conductive layer 160b. A first heatsink 180 may be disposed on the thermal conductive layer 160b. The first heatsink 180 may include a first base portion 180a and at least one first heatsink fin 180b.

A thermal conductive medium 170 may be disposed between the heat emissive circuit element 160 and the first heatsink 180. The thermal conductive medium 170 may insure thermal contact occurs between the heat emissive circuit element 160 and the first heatsink 180, despite their uneven surfaces, thereby improving the heat conduction effect. The thermal conductive medium 170 may be formed of thermal conductive grease or a thermal conductive heatsink sheet, e.g., an aluminum sheet or a copper sheet.

A second heatsink 181 may be disposed near the first heatsink 180 and connected to the first heatsink 180, e.g., by a connecting member 182. The second heatsink 181 may include a second base portion 181a and at least one second heatsink fin 181b. The second base portion 181a may be connected to the chassis 130 and the second heatsink fin 181b may be connected to the connecting member 182. The connecting member 182 may be foldable, i.e., allowing expansion and contraction according to circumstances.

Conventionally, the first heatsink 180 on the heat emissive circuit element 160 and the second heatsink 181 on the chassis 130 may be connected to each other simply, e.g., by a screw (not illustrated). This connection, however, makes it difficult to insure close connection between both the first heatsink 180 to the heat emissive circuit element 160 and the second heatsink 181 to the chassis 130.

That is, due to process tolerances, when the first heatsink 180 is closely connected to the heat emissive circuit element 160, the second heatsink 181 may not be closely connected to the chassis 130, and vice versa. Conventionally, the thickness of the thermal conductive medium 170 on the heat emissive circuit element 160 is adjusted to prevent the above problem, i.e., the thermal conductive medium 170 is thick enough so even if the position of the first heatsink 180 is shifted when connected to the second heatsink 181, the first heatsink 180 remains in thermal contact with the heat emissive circuit element 160. However, when the thermal conductive medium 170 is too thick, the heatsink effect on the heat emissive circuit element 160 is degraded, because the thermal conductive medium 170 has a much lower heat conductivity than that of the heatsink material, .e.g., metal.

In accordance with an embodiment of the present invention, when the connecting member 182 thermally connecting the first and second heatsinks 180 and 181 is foldable, as illustrated in FIGS. 2 and 3, and thus the first heatsink 180 may be closely connected to the heat emissive circuit element 160 or the thermal conductive medium 170, and the second heatsink 181 may simultaneously also be closely connected to the chassis 130 by adjusting the length of the foldable connecting member 182.

The foldable connecting member 182 may be, e.g., an elastic plate folded as illustrated in FIGS. 2 and 3. The elastic plate can move by a given distance in its length direction or in a direction perpendicular to the length direction. The connecting member 182 may have any foldable structure. While a plurality of folds is illustrated in FIGS. 2 and 3, the connecting member 182 may have a single fold. Further, while the folds are illustrated as being angular, the folds may have a curved end. The connecting member 182 may be connected to the first and second heatsinks 180 and 181, e.g., by ceramic bonding, a screw method, a TOX® method, a spinning method, etc.

The TOX® method is a well-known technique for attaching two thin plates together. In the TOX® method, a mold having a groove with a certain shape and a certain size is disposed on one surface of a pair of thin plates facing each other, and then a rod with a certain size is pushed from the other surface of the thin plate pair into the groove of the mold, thereby attaching the thin plates to each other. In the spinning method, a protruded portion of an object is inserted into a through hole formed in another object, and then a hard rod faces an upper surface of the protruded portion exposed through the through hole and is rotated in a direction perpendicular to the upper surface to squash the protruded portion, thereby attaching the two objects together.

The second heatsink 181 may be connected to the chassis 130 by ceramic bonding, a screw method, a TOX® method or a spinning method.

At least one of the first heatsink 180, the second heatsink 181 and the connecting member 182 may be formed to include a material with excellent heat conductivity, e.g., aluminum or copper.

Although the heat emissive circuit element 160 is illustrated as IPM element in the present embodiment, the heat emissive circuit element 160 is not limited to the IPM element, but may be other elements. e.g., a field effect transistor (FET).

An operation of the display module 100 with the first and second heatsinks 180 and 181 and the connecting member 182 will now be described in detail.

When the display module 100 is operated, the driving circuit board 120 operates to apply a voltage to the PDP 110. This applied voltage to the PDP 110 causes an address discharge and a sustain discharge to occur. During the sustain discharge, the energy level of excited discharge gas is lowered to cause an ultraviolet (UV) light to be emitted. The emitted ultraviolet (UV) light excites the phosphor of a phosphor layer (not illustrated) coated inside a discharge cell (not illustrated). Then, the energy level of the excited phosphor is lowered to cause visible light to be emitted. The emitted visible light passes through a first substrate (not illustrated) included in the PDP 110 and is emitted from the first substrate, thereby forming an image.

At this time, heat is generated by the heat emissive circuit element 160 disposed on the driving circuit board 120. The generated heat passes through the thermal conductive layer 160b and is then transmitted to the first heatsink 180, which has a relatively low temperature. Alternatively, the generated heat may be transmitted to the first heatsink 180 through the thermal conductive layer 160b via the thermal conductive medium 170 disposed between the heat emissive circuit element 160 and the first heatsink 180.

Some of the heat transmitted to the first heatsink 180 may be directly transmitted to ambient air by convection, while the rest may be rapidly transmitted through the connecting member 182 to the second heatsink 181 by heat conduction. Also, some of the heat transmitted to the second heatsink 181 may be dissipated into ambient air by convection, while the rest may be transmitted to the chassis 130 directly or indirectly contacting the second heatsink 181 and then dissipated.

As described above, the heat generated by the heat emissive circuit element 160, such as the IPM element, is effectively dissipated to the first heatsink 180, the second heatsink 181 and the chassis 130. Therefore, the generated heat is not concentrated on the heat emissive circuit element 160, thereby reducing the temperature of the heat emissive circuit element 160. Accordingly, it is possible not only to maintain the performance of the heat emissive element 160, but also to extend the lifetime of the heat emissive circuit element 160. Consequently, the lifetime of the display module 100 can be extended.

The present invention is not limited to the display module with the PDP, but can be applied to any display module as long as it includes a component emitting a large amount of heat, e.g., the IPM element.

According to the present invention, it is possible to provide the display module that has an improved heatsink structure for the high heat emissive circuit element, thereby effectively dissipating the heat generated by the heat emissive circuit element through the chassis. Accordingly, it is possible to prevent the degradation of the heat emissive circuit element and thus improve the reliability of the driving circuit board.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A display module, comprising:
    a display panel adapted to reproduce an image;
    a chassis supporting the display panel;
    a driving circuit board disposed on a surface of the chassis opposite to the display panel adapted to generate an electrical signal for driving the display panel, the driving circuit board including at least one heat emissive circuit element;
    a first heatsink disposed on the heat emissive circuit element;
    a second heatsink disposed on the chassis; and
    a foldable connecting member thermally connecting the first heatsink and the second heatsink, wherein the first heatsink and the second heatsink each includes a base portion and at least one heatsink fin.

2. The display module as claimed in claim 1, wherein the foldable connecting member is connected between a heatsink fin located at one end of the first heatsink and a heatsink fin located at one end of the second heatsink.

3. The display module as claimed in claim 1, wherein the base portion of the first heatsink is disposed on the heat emissive circuit element.

4. The display module as claimed in claim 1, wherein the base portion of the second heatsink is disposed on the chassis.

5. The display module as claimed in claim 1, wherein the heat emissive circuit element comprises at least two layers including a main element layer and a thermal conductive layer, and the first heatsink is disposed on the thermal conductive layer.

6. The display module as claimed in claim 1, further comprising a thermal conductive medium disposed between the heat emissive circuit element and the first heatsink.

7. The display module as claimed in claim 6, wherein the thermal conductive medium is thermal conductive grease.

8. The display module as claimed in claim 6, wherein the thermal conductive medium is a thermal conductive heatsink sheet.

9. The display module as claimed in claim 1, wherein the heat emissive circuit element is an IPM (intelligent power module) element formed by combining two or more different ICs (integrated circuits) or by including an IC and an independent circuit element.

10. The display module as claimed in claim 1, wherein at least one of the first heatsink, the second heatsink and the connecting member is formed to include aluminum.

11. The display module as claimed in claim 1, wherein at least one of the first heatsink, the second heatsink and the foldable connecting member is formed to include copper.

12. The display module as claimed in claim 1, wherein the display panel is a plasma display panel adapted to reproduce an image by gas discharge.

13. The display module as claimed in claim 1, wherein the foldable connecting member includes a plurality of folds.

14. The display module as claimed in claim 1, wherein the foldable connecting member is elastic.

15. The display module as claimed in claim 1, wherein the first heatsink comprises a base portion and a plurality of heatsink fins.

16. The display module as claimed in claim 1, wherein the foldable connecting member expands and contracts thereof.

* * * * *